United States Patent
Mitra

(10) Patent No.: US 6,897,447 B2
(45) Date of Patent: May 24, 2005

(54) BIAS CONTROLLED MULTI-SPECTRAL INFRARED PHOTODETECTOR AND IMAGER

(75) Inventor: Pradip Mitra, Colleyville, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 364 days.

(21) Appl. No.: 10/310,613

(22) Filed: Dec. 5, 2002

(65) Prior Publication Data

US 2004/0108461 A1 Jun. 10, 2004

(51) Int. Cl.$^7$ .............................. G01J 5/02; H01L 25/00
(52) U.S. Cl. ................... 250/339.02; 250/338.4
(58) Field of Search .................. 250/339.02, 339.01, 250/338.1, 338.4; 257/21

(56) References Cited

U.S. PATENT DOCUMENTS

| | | |
|---|---|---|
| 3,799,653 A | 3/1974 | Ikeda |
| 3,962,578 A | 6/1976 | Roschen |
| 4,158,133 A | 6/1979 | Spaeth et al. |
| 4,578,527 A | 3/1986 | Rancourt et al. |
| 4,596,930 A | 6/1986 | Steil et al. |
| 4,620,364 A | 11/1986 | Landis |

(Continued)

FOREIGN PATENT DOCUMENTS

JP 64-13767 A 1/1989

OTHER PUBLICATIONS

Thomas K. Gaylord, M. G. Moharam, *Analysis and Applications of Optical Diffraction by Gratings*, Proceedings of the IEEE, vol. 73, No. 5, pp. 894–937, (May 1985).

T. Wipiejewski, K. Panzlaff, K. J. Ebeling, *Resonant wavelength selective photodetectors*, Microelectronic Engineering, 0167–9317/92, pp. 223–229, Elsevier Scient Publishers B. V. (1992).

(Continued)

*Primary Examiner*—Albert Gagliardi
(74) *Attorney, Agent, or Firm*—Sidley Austin Brown & Wood LLP; Stephen S. Sadacca

(57) ABSTRACT

A multi-spectral photodetector for detecting two or more different bands of infrared radiation is described. The photodetector includes a diffractive resonant optical cavity that resonates at the two or more infrared radiation bands of interest. By detecting infrared radiation at two or more discrete applied biases and by generating a spectral response curve for the photodetector at each of these biases, the response to each of the individual bands of infrared radiation can be calculated. The response to each band of infrared radiation can be found by deconvolving the response at each bias. The photodetector finds many uses including military and medical imaging applications and can cover a broad portion of the infrared spectrum.

28 Claims, 5 Drawing Sheets

U.S. PATENT DOCUMENTS

| | | | |
|---|---|---|---|
| 4,625,389 A | 12/1986 | Readhead | |
| 4,639,756 A | 1/1987 | Rosbeck et al. | |
| 4,731,640 A | 3/1988 | Bluzer | |
| 4,783,594 A | 11/1988 | Schulte et al. | |
| 4,822,998 A | 4/1989 | Yokota et al. | |
| 4,875,084 A | 10/1989 | Tohyama | |
| 4,936,653 A | 6/1990 | Schemmel et al. | |
| 4,956,555 A | 9/1990 | Woodberry | |
| 4,970,567 A | 11/1990 | Ahlgren et al. | |
| 5,013,918 A | 5/1991 | Choi | |
| 5,023,944 A | 6/1991 | Bradley | |
| 5,047,622 A | 9/1991 | Chu | |
| 5,075,749 A | 12/1991 | Chi et al. | |
| 5,157,258 A | 10/1992 | Gunning, III et al. | |
| 5,179,283 A | 1/1993 | Cockrum et al. | 250/352 |
| 5,198,659 A | 3/1993 | Smith et al. | 250/214.1 |
| 5,243,458 A | 9/1993 | Hatano et al. | 359/359 |
| 5,261,970 A | 11/1993 | Landis et al. | 136/259 |
| 5,315,128 A | 5/1994 | Hunt et al. | 257/16 |
| 5,329,136 A | 7/1994 | Goossen | 257/17 |
| 5,379,065 A | 1/1995 | Cutts | 348/269 |
| 5,384,469 A | 1/1995 | Choi | 257/21 |
| 5,389,797 A | 2/1995 | Bryan et al. | 257/21 |
| 5,420,681 A | 5/1995 | Woodruff | 356/326 |
| 5,444,236 A | 8/1995 | Ludington et al. | 250/208.1 |
| 5,455,421 A | 10/1995 | Spears | 250/338.4 |
| 5,479,018 A | 12/1995 | McKee et al. | 250/338.1 |
| 5,479,032 A | 12/1995 | Forrest et al. | 257/190 |
| 5,485,015 A | 1/1996 | Choi | 257/21 |
| 5,539,206 A | 7/1996 | Schimert | 250/338.4 |
| 5,543,628 A | 8/1996 | Chow et al. | 257/17 |
| 5,552,603 A | 9/1996 | Stokes | 250/338.4 |
| 5,646,421 A | 7/1997 | Liu | 257/21 |
| 5,726,805 A | 3/1998 | Kaushik et al. | 359/589 |
| 5,773,831 A | 6/1998 | Brouns | 250/370.08 |
| 5,777,390 A | 7/1998 | Berger et al. | 257/749 |
| 5,818,066 A | 10/1998 | Duboz | 257/21 |
| 6,133,571 A | 10/2000 | Dodd | 250/388.4 |
| 6,157,042 A | 12/2000 | Dodd | 257/21 |
| 6,180,990 B1 | 1/2001 | Claiborne et al. | 257/440 |
| 6,355,939 B1 | 3/2002 | Dodd | 257/21 |
| 6,380,531 B1 * | 4/2002 | Sugihwo et al. | 250/214.1 |
| 6,521,967 B1 * | 2/2003 | Bandara et al. | 257/440 |
| 6,642,537 B1 * | 11/2003 | Gunapala et al. | 257/21 |
| 2004/0108461 A1 * | 6/2004 | Mitra | 250/339.02 |
| 2004/0195509 A1 * | 10/2004 | Sundaram et al. | 250/338.1 |

OTHER PUBLICATIONS

H. C. Liu, Jianmeng LI, J. R. Thompson, Z. R. Wasilewski, M. Buchanan and J. G. Simmons, *Multicolor Voltage–Tunable Quantum–Well Infrared Photodetector*, IEEE Electron Device Letters, vol. 14, No. 12, EDLEDZ (ISSN 0741–3106), 4 pages (Dec. 1993).

Gregory E. Terrie, *Applications of Hyperspectral Data in Coastal Marine Environments*, Thesis, Naval Research Laboratory, Stennis Space Center, MS, 59 pages (Nov. 17, 1995).

R. Basedow, P. Silverglate, W. Rappoport, R. Rockwell, D. Rosenberg, *HYDICE Instrument Design and Its Application to Planetary Instruments*, Hughes Danbury Optical Systems, Inc., CT, Abstract Only—1 page (1993).

Peter Silverglate, Ker Li Shu, Dennis Preston, John Stein, Frank Sileo, *Concepts for spaceborne hyperspectral imagery using prism spectrometers*, SPIE, vol. 2267, cover page and pp. 112–120 (Jul. 1994).

C. C. Barron, C. J. Mahon, B. J. Thibeault, G. Wang, W. Jiang, L. A. Coldren, J. E. Bowers, *Resonant–cavity–enhanced pin photodetector with 17 GHz bandwidth–efficienty product*, Electronics Letters, vol. 30, 3 pages (Oct. 13, 1994).

P.C. Pinet, *Spectroscopic Imaging of Solid Planetary Surfaces*, Astronomical Society of the Pacific, ASP Conference Series, vol. 71, pp. 294–297 (1995).

Yudi Adityawarman, R. A. Schowengerdt, *Performance Modeling of Hyperspectral Imaging Sensors for Atmospheric Studies*, Final Technical Report, Naval Research Laboratory, Washington, D.C., pp. 1–25 (Sep. 1994).

M. J. Dahlin, A. W. Hoffman, J. L. West, R. West, J. Santana, S. Ortega, S. Byers, D. Thiede, S. Bailey, E. Herrin, M. Levy, R. Parlato, N. Maassen, *Development of High Speed IR Sensor Chip Technologies, Infrared Readout Electronics III Symposium*, SPIE vol. 2745, pp. 22–39 (Apr. 1996).

O. Saint–Pé, O. Donnadieu, R. Davancens, D. Charlton, A. Menardi, M. Fabbricotti, B. Harnisch, R. Meynart, B. Kunkel, *Development of a 2–D Array for 1 to 2.35 pm Hyperspectral Imager, Infrared Detectors for Remote Sensing: Physics, Materials and Devices Symposium*, SPIE vol. 2816, pp. 138–149 (Aug. 1996).

N. S. Gluck, R. B. Bailey, R. de la Rosa, R. L. Hall, *Two–color imaging by the use of patterned optical filters bonded to focal–plane–array detectors*, Applied Optics, vol. 35, No. 28, pp. 5520–5523 (Oct. 1, 1996).

Aleksandar Zavaljevski, Atam P. Dhawan, David J. Keich, James Riddell, III, *Adaptive multilevel classification and detection in multipsectral images*, Optical Engineering, pp. 2884–2893 (Oct. 1996).

Scott Briles, *Evaluation of Onboard Hyperspectral–Image Compression Techniques for a Parallel Push–Broom Sensor*, SPIE vol. 2758, pp. 332–341 (1996).

Charles T. Willoughby, Jay Marmo, Mark A. Folkman, *Hyperspectral Imaging Payload For The NASA Small Satellite Technology Initiative Program*, IEEE, pp. 67–79 (1996).

Paul L. McCarley, Mark A. Massie, Christopher R. Baxter, Buu L. Huynh, *NeuroSeek Dual–Color Image Processing Infrared Focal Plane Array*, SPIE, vol. 3360, cover page and pp. 13–27 (Apr. 1998).

Meimei Z. Tidrow, *Multicolor Quantum Well Infrared Photodetectors*, Army Research Lab., Adelphi, MD, 11 pages (1998).

Meimei Z. Tidrow, *Recent Progress on Multicolor Quantum Well Infrared Photodetectors*, Proceedings of the Eighth International Conference on Narrow Gap Semiconductors, Shanghai, China; World Scientific, (1998)—Abstract Only, 2 pages.

\* cited by examiner

BIAS CONTROLLED MULTI-SPECTRAL INFRARED PHOTODETECTOR AND IMAGER

BACKGROUND OF THE INVENTION

In the field of infrared (IR) imaging, the current objective is to provide high pixel count imagers at low cost with high performance. InSb, HgCdTe and quantum well infrared photodetector (QWIP) technologies have demonstrated high performance large area imagers. Each of these technologies has various strengths and weaknesses. InSb photodetectors offer high performance, ease of fabrication and operation at wavelengths of less than 5 μm, but must be cooled to approximately 80 K. HgCdTe photodetectors can be designed to operate in the important long wavelength IR (LWIR) band corresponding to a wavelength range of 8 to 12 μm and the middle wavelength IR (MWIR) band corresponding to a wavelength range of 3 to 5 μm. HgCdTe photodetectors require very tight tolerances in material and fabrication uniformity, especially in the LWIR band, to ensure high performance. QWIP photodetectors have been demonstrated in both the MWIR and LWIR bands. Because of the maturity of the GaAs/AlGaAs material system used in QWIP photodetectors, tight tolerances in both material and fabrication uniformity are readily obtained. QWIP photodetector sensitivity is generally lower than that achieved by InSb or HgCdTe photodetectors in their respective wavelength bands.

Dual-band or multi-spectral detection is increasingly desirable as a method to increase the probability of detection under various environments. As an example, objects that are only slightly above room temperature, such as a person, are most easily detected in the LWIR corresponding to the peak IR radiation emission band for near room temperature objects. In contrast, a hot object, such as an automobile exhaust pipe, can be readily detected in the MWIR corresponding to the peak IR radiation emission band for objects having a temperature of more than 600 K. Thus, a system that provides high performance with either of these objects should be sensitive to both wavelength bands.

In military applications, it is possible to camouflage an object such that the object emits little radiation in a particular portion of the IR spectrum. A dual-band or multi-spectral photodetector with appropriately selected sensing wavelengths therefore provides a means of detecting objects that have been camouflaged in this manner.

Additional applications may use dual-band or multi-spectral photodetectors for discriminating one object from another. As two objects at different temperatures emit different amounts of IR radiation at different wavelengths, a dual-band or multi-spectral photodetector can more readily discriminate between the objects. As an example, two identical cars may be parked next to each other. If one has recently been driven while the second has not been operated for several hours, a dual-band or multi-spectral detector could readily sense the subtle differences in emissivities corresponding to temperature differences of less than a degree.

Medical applications can also benefit from the additional discrimination that can be achieved with a dual-band or multi-spectral photodetector. In particular, detection of cancerous lesions using infrared imaging has shown great promise. The sensitivity of such systems can be increased by imaging at two or more wavelengths to remove any artifacts in the image, such as might be caused by birthmarks, scars, tattoos, etc. The use of two or more wavelengths will also increase sensitivity as smaller temperature differences can be detected.

Conventional IR detector technologies have proven difficult to adapt to this current demand for dual-band or multi-spectral detection. As noted above, high performance single band detectors and imaging arrays have been demonstrated using HgCdTe, InSb and QWIP technologies. Of these, dual-band or multi-spectral detection is possible only with the HgCdTe and QWIP technologies. The dual-band and multi-spectral HgCdTe photodetectors demonstrated to date have suffered significantly from both non-uniformity in the HgCdTe material and the fabrication process. While dual-band and multi-spectral QWIP photodetectors do not place as stringent requirements upon the starting material, the fabrication process has similarly proven quite challenging. Further, both IR detector technologies have suffered from reduced performance in dual-band or multi-spectral photodetectors in comparison to single band performance. Lastly, operation in more than one wavelength band has generally required at least one electrical connection between the photodetector and the external electronics for each wavelength band.

In view of the desirability of dual-band and multi-spectral IR photodetectors, there exists a need for a design that places fewer and/or less stringent requirements upon the starting material and/or the fabrication process. Such photodetectors should also be highly producible. It is also desirable to develop a photodetector technology that requires fewer electrical connections between each photodetector and the external electronics. Furthermore, it is desirable to readily change from detecting in one wavelength band to another wavelength band, even alternating consecutive images between two or more wavelength bands.

SUMMARY OF THE INVENTION

In one embodiment of the present invention, a multi-spectral IR photodetector comprises in order, a top electrical contact, a series of elongate IR absorbing elements for absorbing two or more bands of IR radiation, a bottom electrical contact and a reflector. These elements form a diffractive resonant optical cavity (DROC) for the two or more bands of IR radiation. This is in contrast to previous DROC designs that required multiple cavity designs to support multiple bands of IR radiation, such as the designs found in U.S. Pat. No. 6,452,187. A photoresponse is sensed by applying an external bias between the top and bottom contacts and measuring the resulting current. By changing the magnitude and/or polarity of the applied bias, the ratio of the photoconductive response between the two or more bands of IR radiation changes. Therefore, the relative magnitude of the IR radiation detected in each of the two or more bands can be established by changing the applied bias.

In another embodiment of the present invention, a multi-spectral IR photodetector comprises in order, a top electrical contact, a series of elongate IR absorbing elements for absorbing two or more bands of IR radiation, a bottom electrical contact and a reflector. These elements form a doubly periodic DROC. The doubly periodic DROC has a period in a first direction to diffract at least one of the bands of IR radiation and a different period in a perpendicular direction to diffract at least one of the other bands of IR radiation. Again, the relative magnitude of the IR radiation detected in each of the two or more bands can be established by changing the bias applied between the top and bottom contacts.

In yet another embodiment of the present invention, a dual-band IR imager includes an array of pixel elements, with each pixel element comprising in order, a top electrical contact, a series of elongate IR absorbing elements for absorbing two bands of IR radiation, a bottom electrical contact and a reflector. These elements form a DROC for the two bands of IR radiation. The dual-band IR imager further includes readout electronics that bias the pixel elements at two different applied voltages. The readout electronics then multiplex the resultant photoresponse signals at the two different applied biases.

In each embodiment, the applied bias is placed across the elongate IR absorbing elements via the top and bottom contacts such that a resulting current flow is along an axis of the elongate IR absorbing elements. A magnitude of the resulting current flow is indicative of the quantity of IR radiation absorbed by the elongate IR absorbing elements. Changing the magnitude and/or polarity of the applied bias results in non-linear changes in the response magnitudes of each band of IR radiation. Therefore, the relative magnitude of the IR radiation detected in each band can be established by changing the applied bias and through using external signal processing circuitry. The number of individual bands being sensed must be less than or equal to the number of different applied biases to allow establishing signals that are proportional to each individual band of IR radiation absorbed.

Photodetectors comprising a single multi-spectral IR photodetector, a one-dimensional line array of photodetectors and a two-dimensional area array of photodetectors are envisioned. The one- and two-dimensional arrays of photodetectors are readily amenable to forming imagers for various applications. Depending upon the desired bands of IR radiation, a number of different material systems may be used to form the IR absorbing elements.

BRIEF DESCRIPTION OF THE DRAWINGS

The present invention is described in reference to the following Detailed Description and the drawings in which.

DETAILED DESCRIPTION OF THE PREFERRED EMBODIMENTS

Various embodiments of the present invention are described in detail with reference to the drawings with corresponding elements having corresponding numbers throughout the drawings. While the following description will generally discuss a dual-band IR photodetector, altering the design of the IR absorbing layer can lead to absorption in three or more IR wavelength bands.

Figure 1:
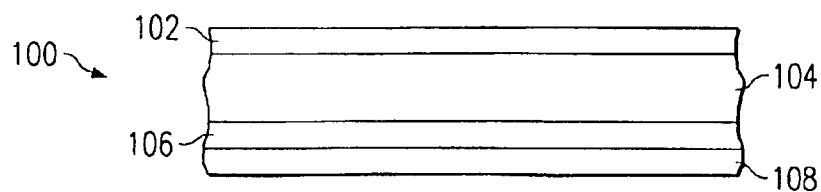
FIG. 1 is a cross-sectional view of the starting material for first and second embodiments of the present invention.

FIG. 1 is a cross-sectional view of the starting material 100 used in fabricating a dual-band IR photodetector in accordance with the two embodiments. The starting material 100 includes a series of laminae formed in succession. A top contact 102 is formed of doped semiconductor material. The top contact 102 is preferably heavily doped to reduce contact resistance and has a thickness of approximately 0.2 to 0.5 $\mu$m. An IR absorbing layer 104 is formed of semiconductor material that absorbs IR radiation in first and second IR wavelength bands. The IR absorbing layer 104 preferably has a thickness of between 0.4 and 1.0 $\mu$m. A bottom contact 106 is formed of doped semiconductor material. The bottom contact 106 is preferably heavily doped to reduce contact resistance and has a thickness of approximately 0.2 to 0.5 $\mu$m. A reflector 108 that is highly reflective to both the first and second bands of IR radiation completes the starting material 100. The reflector 108 is preferably metallic and formed of gold, aluminum or an alloy of two or more metals. The thickness of the reflector 108 is preferably between 0.1 and 0.25 $\mu$m. Alternatively, the reflector 108 can be formed of a Bragg reflector designed to be highly reflective to both the first and second bands of IR radiation. Further, the reflector 108 is preferably planar. A bottom ohmic contact 110, is in electrical contact with the bottom contact 106 such that the signal may be provided to the external electronics. The bottom ohmic contact 110 is preferably formed of an alloy of Ni/Au/Ge or Au/Sn/Au and has a thickness of 0.1 $\mu$m.

The IR absorbing layer 104 can be formed of several different materials and material systems, only one of which will be examined in detail hereinafter. The preferred material comprises n-type multiple quantum wells (MQWs) formed of GaAs and its alloys such as AlGaAs and InGaAs. QWIPs and Enhanced QWIPs (EQWIPs) have demonstrated high levels of performance using GaAs/AlGaAs and InGaAs/AlGaAs MQW IR absorbing layers.

Figure 2A:
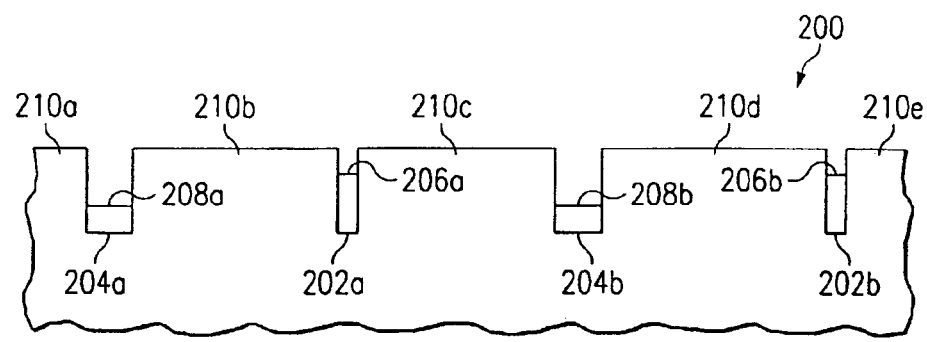
FIGS. 2a–d are energy band diagrams for different starting materials for use in the present invention.

FIGS. 2a through 2d illustrate the conduction band energy diagram for four different possible MQW-based IR absorbing materials. FIG. 2a illustrates MQW material 200 having isolated or uncoupled quantum wells 202a,b and 204a,b. Isolated or uncoupled means that the ground state energy levels 206a,b in quantum wells 202a,b do not interact with the ground state energy levels 208a,b of quantum wells 204a,b. This is accomplished by having relatively thick barriers 210a–e. Typical barrier widths are 300–500 Å. The quantum wells 202a,b and 204a,b preferably comprise GaAs and will have a width of 20–50 Å depending upon the IR radiation band to be absorbed. As illustrated in FIG. 2a, quantum wells 202a,b are narrower than quantum wells 204a,b, and thus absorb the longer of the two IR radiation wavelength bands. The different width quantum wells need not be interleaved as illustrated in FIG. 2a, but may form two groups of equal width quantum wells. If two groups of equal width quantum wells are used rather than interleaved quantum well widths, it is preferable that the quantum wells for absorbing the shorter IR radiation wavelength band be placed closer to the reflector 108. The barriers 210a–e preferably comprise $Al_xGa_{1-x}As$, where $0.1 \leq X \leq 0.6$ depending upon the IR radiation bands to be absorbed.

Figure 2B:
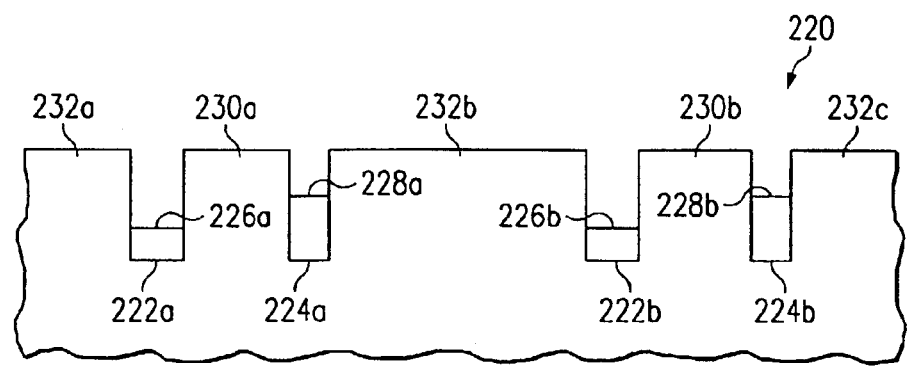

A second starting material 220 design is illustrated in FIG. 2b. In contrast to the isolated or uncoupled quantum wells in MQW material 200, the quantum wells 222a,b and 224a,b are weakly coupled. In this case, the ground state energy levels 226a,b of quantum wells 222a,b slightly interact with the ground state energy levels 228a,b of quantum wells 224a,b, causing each to broaden. The weakly coupled quantum wells are separated by narrow barriers 230a,b, while each pair of weakly coupled quantum wells is separated by a broad barrier 232a–c. Preferred narrow barrier widths are 100–200 Å while the preferred broad barrier widths are 300–500 Å. As with MQW material 200, the quantum wells within each coupled pair are of different widths. As illustrated in FIG. 2b, quantum wells 222a,b are broader than quantum wells 224a,b and will therefore absorb the shorter of the two IR radiation wavelength bands. The quantum wells 222a,b and 224a,b preferably comprise GaAs and will have a width 20–50 Å depending upon the IR radiation bands to be absorbed. In addition, like MQW material 200, the barriers 230a,b and 232a–c will comprise $Al_xGa_{1-x}As$, where $0.1 \leq X \leq 0.6$ depending upon the IR radiation bands to be absorbed.

Figure 2C:
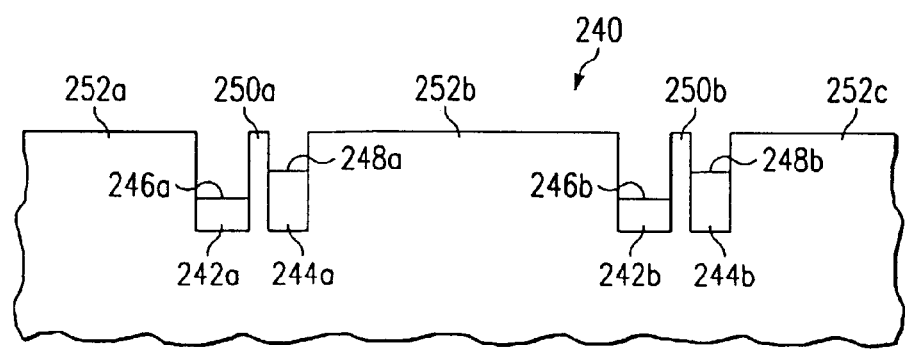

FIG. 2c illustrates strongly coupled MQW material 240. The ground state energy levels 246a,b of quantum wells 242a,b strongly interact with the ground state energy levels 248a,b of quantum wells 244a,b, causing each to significantly broaden. Under the appropriate applied bias, the ground state energy levels 246a,b will align with the ground state energy levels 248a,b leading to potentially higher IR absorption and dark current. The coupled quantum wells are separated by narrow barriers 250a,b, while each pair of coupled quantum wells is separated by a broad barrier 252a–c. Preferred narrow barrier widths are 20–75 Å while the preferred broad barrier widths are 300–500 Å. As with MQW material 200, the quantum wells within each coupled pair are of different widths. As illustrated in FIG. 2c, quantum wells 242a,b are broader than quantum wells 244a,b and will therefore absorb the shorter of the two IR radiation wavelength bands. The quantum wells 242a,b and 244a,b preferably comprise GaAs and will have a width 20–50 Å depending upon the IR radiation bands to be absorbed. In addition, like MQW material 200, the barriers 250a,b and 252a–c will comprise $Al_xGa_{1-x}As$, where $0.1 \leq X \leq 0.6$ depending upon the IR radiation bands to be absorbed.

Figure 2D:
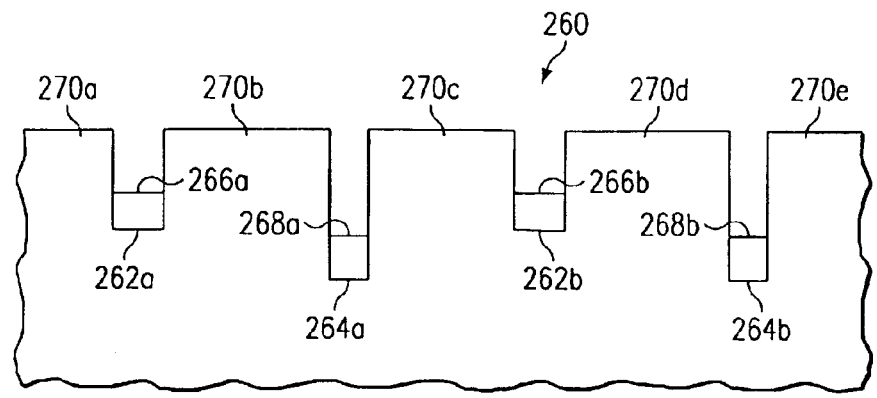

A fourth type of MQW material 260 suitable for absorbing IR radiation is shown in FIG. 2d. This MQW material 260 uses quantum wells 262a,b formed of GaAs, while quantum wells 264a,b are formed of InGaAs. By using InGaAs as the quantum well material, the ground state energy levels 268a,b of quantum wells 264a,b are lower, allowing the absorption of shorter IR wavelengths than the ground state energy levels 266a,b of quantum wells 262a,b. As with MQW material 200, the quantum wells 262a,b and 264a,b can be either interleaved or grouped. The quantum wells 264a,b comprise $In_yGa_{1-y}As$, where $0.0 \leq Y \leq 0.15$ depending upon the IR radiation bands to be absorbed. The barriers 270a–e will preferably have a thickness of 300–500 Å and will comprise $Al_xGa_{1-x}As$, where $0.1 \leq X \leq 0.6$ depending upon the IR radiation bands to be absorbed.

Figure 3A:
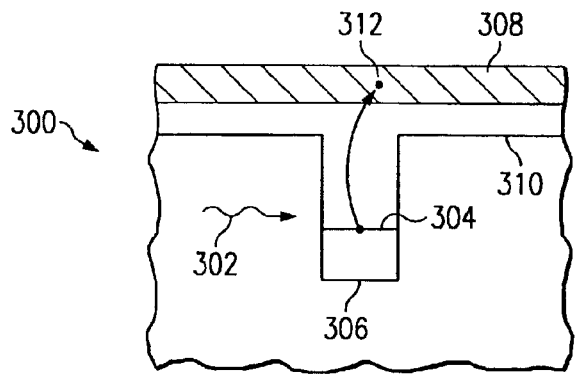
FIGS. 3a–c are IR absorption mechanisms for different starting materials for use in the present invention.

A number of IR absorption mechanisms are feasible with the above four MQW material types. First is a bound to continuum (BTC) type material 300 as shown in FIG. 3a. In BTC type material, the IR radiation is absorbed when an incident photon 302 excites a ground state electron 304 from a GaAs quantum well 306 into the energy continuum 308 above the AlGaAs barrier energy 310. Due to quantum mechanical selection rules, the incident photon 302 must have an electric field component that is normal to the plane of the quantum well 306 if the incident photon 302 is to be absorbed by lattice matched MQW material 200, 220, 240 and 260. By applying an electric field across the BTC material 300, the excited electron 312 is swept from the IR absorbing material 104, collected in either the top or bottom contact 102, 106 depending upon the applied polarity and detected in an external circuit. For absorption in the MWIR, the barriers of the BTC type material 300 will preferably have an aluminum content X in the range of 0.4 to 0.6. For absorption in the LWIR, the barriers of the BTC type material 300 will preferably have an aluminum content X in the range of 0.1 to 0.4.

Figure 3B:
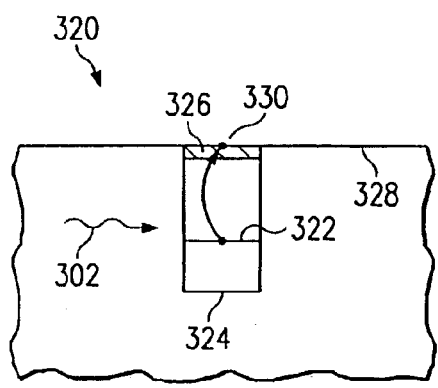

A second IR absorption configuration is bound to quasi-continuum (BTQC) type material 320 and is illustrated in FIG. 3b. In BTQC material 320, the IR radiation is absorbed when an incident photon 302 excites a ground state electron 322 from a quantum well 324 into an energy state 326 approximately equal to the barrier energy 328. By applying an electric field across the BTQC type material 320, the excited electron 330 is swept from the IR absorbing material 104, collected in either the top or bottom contact 102, 106 and detected in an external circuit. Example material parameters for the BTQC type material 320 are quite similar to the BTC type material 300, with the exception of the quantum well thickness. A slightly wider quantum well 324, having a thickness of 25–50 Å, is required to create the energy state that is approximately equal to the barrier energy 328. Like the BTC type material 300, the BTQC type material 320 IR absorption wavelengths are typically controlled by the specific quantum well thickness and barrier composition.

Figure 3C:
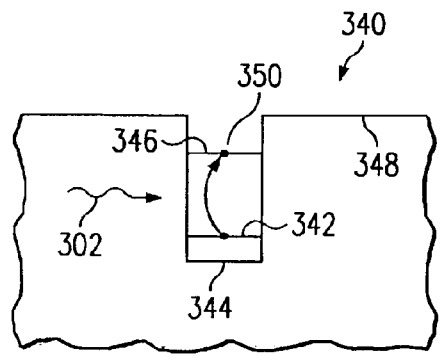

A third IR absorption configuration illustrated in FIG. 3c, uses two bound energy states, and thus is known as bound to bound (BTB) type material 340. In BTB type material, the IR radiation is absorbed when an incident photon 302 excites a ground state electron 342 from a quantum well 344 into a bound energy state 346 less than the AlGaAs barrier energy 348. By applying an electric field across the BTB type material 340, the excited electron 350 tunnels through a portion of the adjacent barrier and is swept from the IR absorbing material 104, collected in either the top or bottom contact 102, 106 and detected in an external circuit. Example material parameters for the BTB type material 340 are generally similar to the BTC type material 300, with the exception of the quantum well width. The quantum well width must be greater than that of similar BTC type material 300 as two bound energy states must be created. Typical quantum well widths in BTB material 340 range from 30 to 60 Å.

In any of the BTC, the BTQC and the BTB type materials 300, 320, 340, the quantum well can alternatively be $In_yGa_{1-y}As$, wherein $0.0<Y<0.15$. A further alternative is the use of a material system such as InGaAs/InAlAs, InGaAs/InP or various other III–V or II–VI based material systems. Yet another alternative is the use of p-type MQW material in which a ground state energy hole is excited during absorption of the incident photon. It should be noted that p-type MQW material places no requirements on the polarization of the photon's electric field. Molecular beam epitaxy (MBE) or metal-organic chemical vapor deposition (MOCVD) can be used to form the various type IR absorbing materials from the different III–V and II–VI material systems.

The conduction band energy diagrams of FIGS. 2a–d illustrate only two quantum well widths, thus leading to two different absorption bands. For a dual-band IR photodetector, the designs illustrated in FIGS. 2a–d are sufficient. However, for a multi-spectral IR photodetector that absorbs in three different bands, three different well widths would be required. Due to the very precise nature of MBE and MOCVD, forming IR absorbing material with quantum well widths that differ by 5 Å is possible.

Therefore, an IR absorbing material for a triple-band IR photodetector could have quantum well widths of 25 Å, 30 Å and 38 Å.

Figure 4:
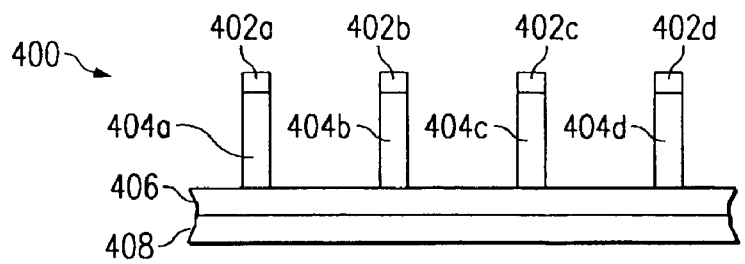
FIG. 4 is a cross-sectional view of the first embodiment of the present invention.
Figure 6:
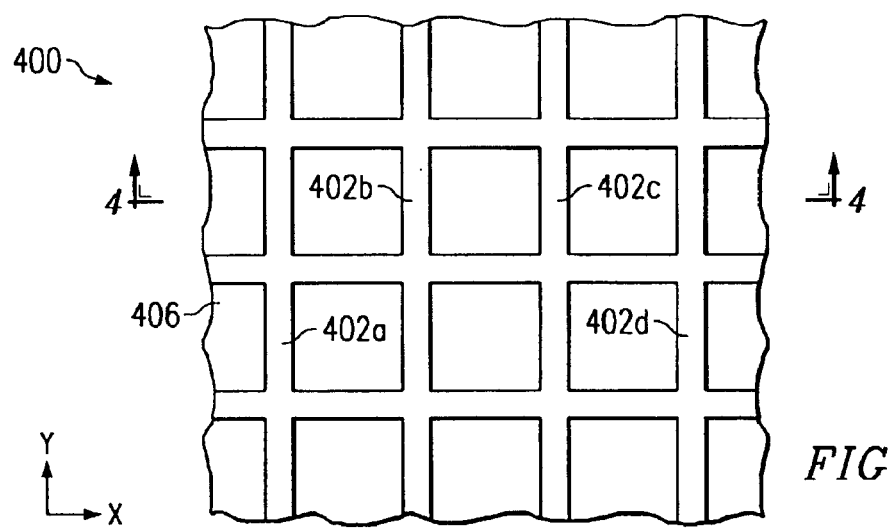
FIG. 6 is a top down view of the first embodiment of the present invention.
Figure 5:
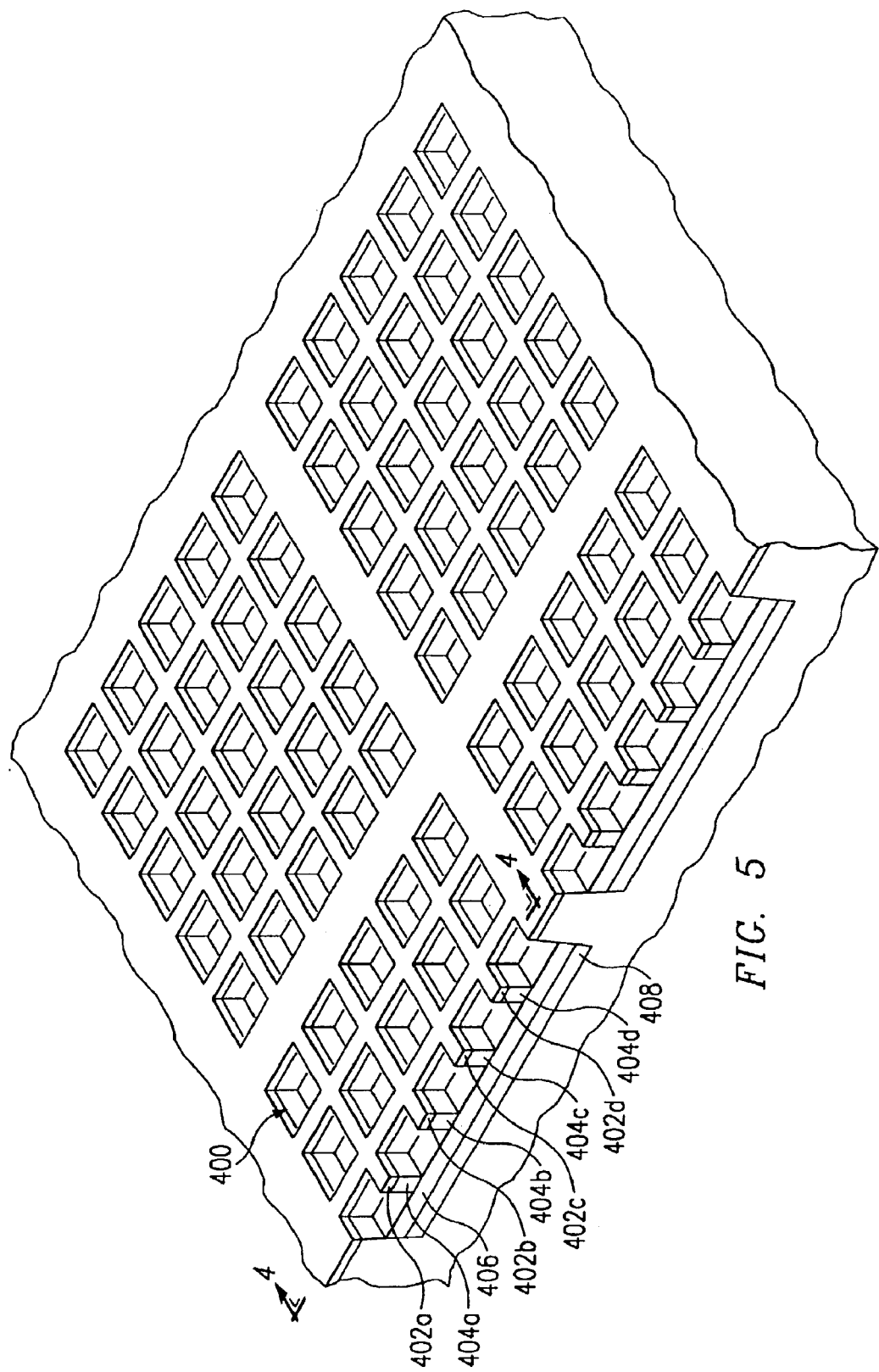
FIG. 5 is a perspective view of the first embodiment of the present invention.

A dual-band IR photodetector 400 according to a first embodiment of the present invention is illustrated in FIG. 4 and can be formed from any of the various starting materials described above. The first embodiment is formed through a process comprising an etching step and a metal deposition step thereby fabricating the dual-band IR photodetector 400. The etch process removes a portion of the top contact 102 (FIG. 1) and the dual-band IR absorbing layer 104 down to the bottom contact 406, resulting in top contact elements 402a–c, and IR absorbing layer elements 404a–c. The resulting width of the top contact elements 402a–c and the dual-band IR absorbing layer elements 404a–c is from 0.8 to 1.6 µm depending upon the two desired IR wavelength bands. Note that while top contact elements 402a–c appear to be separate in FIG. 4, top contact elements 402a–c are electrically interconnected as shown in FIGS. 5 and 6. The reflector 408 is deposited on the side of the bottom contact 406 opposite the etched portion. The fabrication process need not be conducted in this sequence.

While the above etching processes may appear difficult, two different possible approaches to the processes have been developed. Both processes are based upon the difference in etch rates of different materials. In the simplest solution, the etch rate of the bottom contact 406 is significantly lower than the etch rate of the dual-band IR absorbing layer 104. In this case, the etch can be timed to ensure the dual-band IR absorbing layer 104 is completely removed with little fear of removing much of the bottom contact 406. The second solution would be used in the case where the etch rate between the dual-band IR absorbing layer 104 and the bottom contact 406 is similar. In this case, an etch stop layer (not illustrated) is placed between the dual-band IR absorbing layer 104 and the bottom contact 406. The selected etch stop layer material preferably has an etch rate that is significantly lower than the etch rate of the dual-band IR absorbing layer 104. As an example, the etch rate of $Al_{0.6}Ga_{0.4}As$ is significantly less than the etch rate of $Al_{0.3}Ga_{0.7}As$. As the dual-band IR absorbing layer 104 may comprise $GaAs/Al_{0.3}Ga_{0.7}As$ MQW material, an etch stop comprised of $Al_{0.6}Ga_{0.4}As$ is feasible.

Two alternative structures are also possible. As seen in FIG. 4, the etching is stopped at the interface between the dual-band IR absorbing layer 104 and the bottom contact 406. The first alternative, not illustrated, is to etch partially into the bottom contact 406. The second alternative, also not illustrated, is to etch completely through the bottom contact 406 to the reflector 408. These two alternatives provide an additional degree of design freedom. The second alternative also offers the advantage that as the reflector 408 preferably comprises a metal such as gold, which has an extremely low etch rate, the etch process is simplified.

The dual-band IR photodetector 400 illustrated in FIGS. 5 and 6 forms a DROC that resonates at two different wavelengths for IR radiation incident on the dual-band IR photodetector 400 from the top contact elements 402a–c side. The two resonant wavelengths are controlled in part by the period of the top contact elements 402a–c and the elongate dual-band IR absorbing elements 404a–c, by the width of the top contact elements 402a–c and the dual-band IR absorbing elements 404a–c and by the thicknesses of the top contact elements 402a–c, the bottom contact 406 and the dual-band IR absorbing elements 404a–c. Lastly, the two resonant wavelengths are controlled in part by the material design of the dual-band IR absorbing layer elements 404a–c.

It must be noted that in contrast to conventional dual-band IR photodetectors, the IR radiation is incident on interleaved IR absorbing quantum wells or on the grouped longer wavelength IR absorbing quantum wells. In conventional dual-band IR photodetectors, if the IR radiation were incident on the longer wavelength IR absorbing layer, this longer wavelength IR absorbing layer would absorb the shorter wavelength IR radiation as well. This would result in significant cross-talk within the longer wavelength signal and little short wavelength signal. However, electromagnetic field modeling of the first embodiment showed the longer wavelength radiation generated high electric field regions closer to the top contact elements 402a–c corresponding to the longer wavelength absorbing material when the quantum wells are grouped rather than interleaved. Likewise, the shorter wavelength radiation generates high electric field regions closer to the bottom contact 406 corresponding to the shorter wavelength absorbing material when the quantum wells are grouped.

The removal of a portion of the dual-band IR absorbing layer 104 provides several advantages. By creating the DROC, the photoresponse of the dual-band IR photodetector 400 is enhanced as IR radiation of the appropriate wavelength resonates within the cavity increasing absorption. Thus, the cavity improves the signal generated or quantum efficiency of the dual-band IR photodetector 400. Secondly, the generated dark current is reduced. The dark current is generated within the dual-band IR absorbing layer elements 404a–c. By removing a significant portion of the dual-band IR absorbing layer 104, a reduction in dark current is observed. The dark current generates noise within the signal from the dual-band IR photodetector 400. As this dark current induced noise is the primary source of noise under certain operating conditions, reducing the dark current is important to improving the sensitivity of the dual-band IR photodetector 400. As the DROC increases quantum efficiency and reduces dark current and therefore noise, the dual-band IR photodetector 400 has a higher signal to noise ratio or sensitivity when compared to other dual-band IR photodetector technologies.

Figure 7:
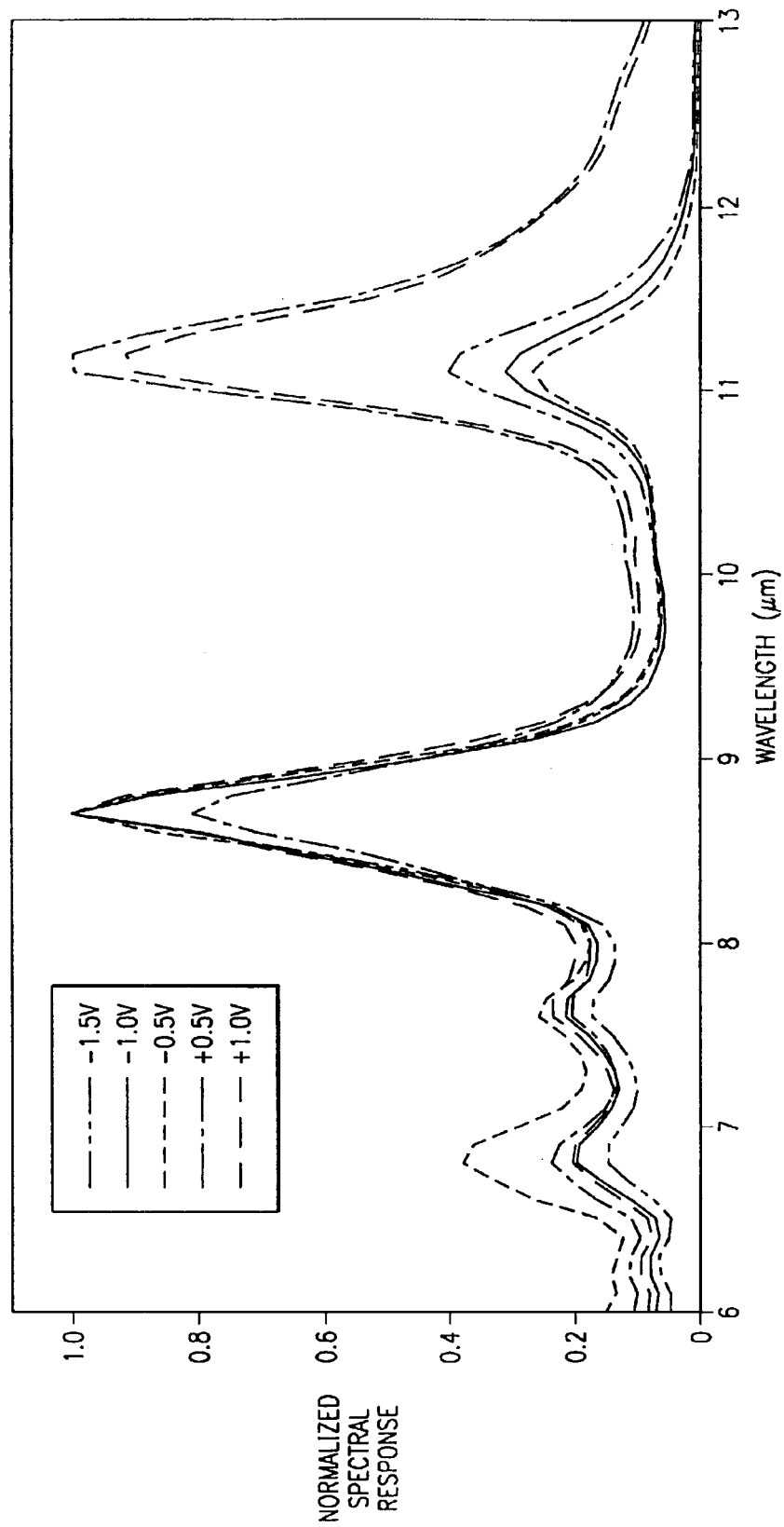
FIG. 7 is a spectral response of a photodetector corresponding to the first embodiment of the present invention.

FIG. 7 shows the spectral response for a dual-band IR photodetector made in accordance with this first embodiment. As can be seen, the dual-band IR photodetector exhibits strong photoresponse in two narrow bands of LWIR radiation. Each of the response peaks is approximately 0.5 µm in width with the first band centered at 8.7 µm and the second band centered at 11.1 µm.

The relative strength of the photoresponse for each of the two bands is also clearly illustrated in FIG. 7. For negative applied biases, the 8.7 µm band has a photoresponse approximately 3 times as large as the 11.1 µm band. For positive applied biases, the photoresponses are approximately equal. Therefore, the ratio of the photoresponse of the 8.7 µm band to the photoresponse of the 11.1 µm band is a relatively strong function of applied bias.

External electronics can be used to separate the photoresponses of the two bands due to their strong function of applied bias. By generating spectral response curves for the dual-band photodetector at two known applied biases, preferrably using a blackbody radiation source, the photoresponse due to radiation emitted by a target in each band can readily be calculated. The photoresponse calculations generally correspond to two unknowns (the response to IR radiation at the two known applied biases) and two equations (the spectral response curve at each bias), which can then be easily solved. Algorithms that are more complex may be desirable for even greater sensitivity. Preferably, the algorithm deconvolves the two measured responses using the generated spectral response curves at the two known biases. This deconvolution algorithm is especially preferable when three or more spectral response curves at three or more corresponding known biases are used. When only two bands of IR radiation are detected, the two known applied biases are preferably of opposite polarity. Note that the number of different applied biases must be equal to or greater than the number of infrared bands to be deconvolved. Therefore, a triple-band IR photodetector would require the application of at least three biases.

The external electronics used in conjunction with a single dual-band IR photodetector or an array of photodetectors in accordance with the first embodiment can be relatively complex. If an array of dual-band IR photodetectors is created for use in an imager, a silicon readout integrated circuit (ROIC) can be used to perform many of the required functions. The ROIC is preferably indium bump bonded to the array of photodetectors to provide electrical, thermal and mechanical connections. The ROIC can be used to provide the two or more applied biases required to collect the excited electrons from the array of photodetectors. These collected electrons will typically be used to charge a separate capacitor for each photodetector for a given integration time, thereby producing a signal voltage. If space permits, a separate capacitor for each bias for each photodetector is preferable. A separate capacitor for each bias for each photodetector reduces the memory requirements for the ROIC.

Once a scene has been imaged for the integration time at each bias, the resulting signal voltages are deconvolved using the stored spectral response curves. The stored spectral response curves are based upon the photodetectors' responses under the two or more applied biases, preferably when illuminated by blackbody radiation. Upon deconvolution, the signals for each of the two or more bands can be multiplexed to an external system for further manipulation and/or display. While the above functions would preferably be performed by the ROIC, the ROIC may be limited to merely providing the two or more biases, integrating the charge and then multiplexing the resultant signal voltages to an external system. In this case, the external system would then deconvolve the signal voltages based upon the stored spectral response curves, thereby simplifying ROIC design.

A dual-band IR imager using the present invention could operate in two different modes. For an application requiring rapid detection of an object, the output from the bias resulting in the greatest sensitivity would be used. Alternatively, the sum of the signals at each bias could be used. Once the object had been detected, the dual-band IR imager would be switched into an object identification mode. In this object identification mode, the infrared spectral emissions at two wavelengths would be detected. As many objects have distinctive thermal signatures, i.e., they do not emit the same amount of radiation at all wavelengths, the target could be identified. This object identification mode would require storing the thermal signatures of a number of possible objects to improve the likelihood of object identification.

While the first embodiment was illustrated with equal periods in both the X and Y directions as seen in FIG. 6, this need not be the case. For an application that requires broader first and second band spectral response, a different period may be used in the X and Y directions. An initial design, such as that illustrated in FIG. 6, has a period of 5.9 $\mu$m in both the X and Y directions. This leads to a dual-band IR photodetector having first and second band spectral response peaks at 8.7 $\mu$m and 11.2 $\mu$m respectively. By increasing the period in the Y direction by 24% relative to the period in the X direction, the first band spectral response could include resonances at 8.7 and 11.2 $\mu$m while the second band spectral response could include resonances at 9.9 and 12.7 $\mu$m. Thus, slightly varying the periodicity in the two perpendicular directions can broaden the spectral response, though the magnitude of the photoresponse will likely decrease.

The first embodiment was illustrated with dual-band IR absorbing elements 404a–c having equal widths for elements oriented in both the X and Y directions. Equal widths in both the X and Y directions are not required. The use of different width dual-band IR absorbing elements 404a–c in the X direction relative to the Y direction provides an additional degree of freedom when designing the dual-band IR photodetector 400.

Figure 8:
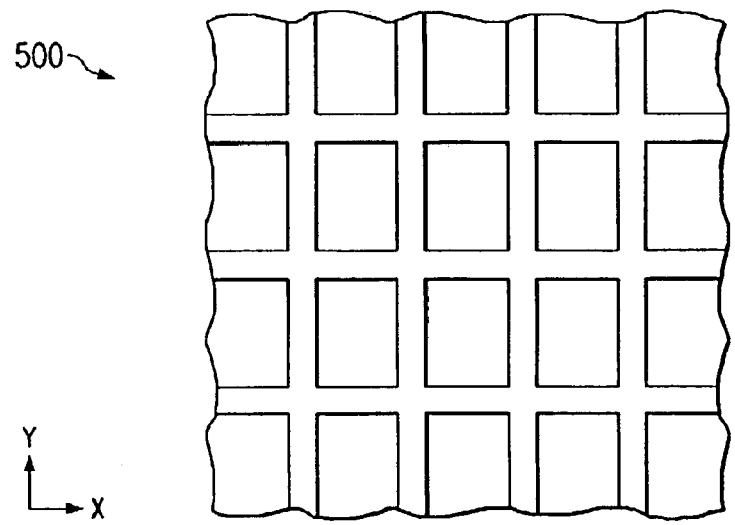
FIG. 8 is a top down view of the second embodiment of the present invention.

A dual-band IR photodetector 500, according to a second embodiment of the present invention, is illustrated in FIG. 8. In the second embodiment, the periodicity in the X and Y directions is different as seen in FIG. 8. The shorter wavelength band is more strongly diffracted by the DROC in the X direction (smaller period) while the longer wavelength band is more strongly diffracted by the DROC in the Y direction (greater period). A dual-band IR photodetector designed to respond in the MWIR and the LWIR could have a 3.0–4.0 $\mu$m period in the X direction while having a 7.0–8.0 $\mu$m period in the Y direction. The design process is simpler in the second embodiment as the periodicity and width in each direction can quickly be optimized through electromagnetic field modeling. Note, however, that truly optimized designs will require both electromagnetic field modeling and experimental results. As each wavelength band is most efficiently coupled in only one direction corresponding to one polarization, photoresponse corresponding to the second polarization is reduced. Thus, an engineering trade-off is required when selecting between the first and second embodiments.

As indicated above, when using MQW material for the dual-band IR absorbing layer 104, the IR radiation must have an electric field component that is perpendicular to the plane of the quantum well. It has been found, both experimentally and through electromagnetic field modeling, that a DROC of the type found in the first and second embodiments is efficient at rotating the plane of electric field polarization of the incident IR radiation. This is important, as the incident IR radiation will typically be normally incident upon the dual-band IR photodetector 400. The normally incident IR radiation will have its electric field polarized in the plane of the quantum well and thus little IR radiation would be absorbed. Therefore, use of the DROC design of the first and second embodiments is quite advantageous.

An important factor in the described embodiments is a non-linear change in the spectral response of the dual-band or multi-spectral IR absorbing layer 104 as a function of bias. If the output signal for the photodetector does not exhibit any spectral dependence upon applied bias, then the signal cannot be deconvolved to establish a signal for each of the two or more spectral bands. The underlying physics of the spectral bias dependence depends on at least the ground state electron population within the quantum wells and electron transport within the photodetector. The ground state electron population depends in part upon doping the quantum well with n-type dopants. Wider quantum wells, such as those required for shorter IR wavelength bands can more easily be doped to higher levels due to their width. The quantum well ground state electron population must be kept high to ensure electrons are present to absorb an incident IR photon. The refilling of the quantum well comes in part from the dark current within the photodetector. In the weakly coupled quantum wells of IR absorbing material 220, this dark current will tend to collect in the first quantum well encountered. That is, electrons that are transported through the barrier will most likely scatter into the first quantum well after the barrier. In FIG. 2b, this would correspond to scattering into quantum wells 222a,b under one polarity and quantum wells 224a,b under the opposite polarity. This is shown in FIG. 7 where the response for a negative applied bias shows filling of the broader quantum well is favored, i.e., the shorter wavelength response is enhanced relative to positive applied bias.

Electron transport differences are pronounced when the quantum wells are grouped according to well width. Experiments have shown that at low biases, longer wavelength response is typically enhanced as little of the applied bias is dropped across the shorter wavelength group of quantum wells. With little applied bias being dropped across the shorter wavelength group of quantum wells, excited electrons are much more likely to scatter into the longer wavelength group of quantum wells. At higher biases, more of the applied bias is dropped across the shorter wavelength group of quantum wells and the excited carriers are more likely to be collected at the contact.

In the strongly coupled MQW material 240, the ground state electron populations are a function of bias. At certain applied biases, the ground states of the coupled quantum wells are at the same energy. This tends to equalize the response from the coupled quantum wells. At other biases, one or the other of the quantum wells will be lower and tend to have a majority of the ground state electrons leading to greater response for the higher populated quantum well. For BTB type material 340 using strongly coupled quantum wells, having the excited state in one quantum well aligned with either the ground state or the excited state of the other quantum well allows excited carriers to more readily tunnel out of the first quantum well and be collected at the contact. For these reasons, strongly coupled MQW material 240 exhibits a very strong bias dependence. This advantage is at least partially offset due to the generally larger dark current exhibited by strongly coupled MQW material 240.

Although the present invention has been fully described by way of examples with reference to the accompanying drawings, it is to be noted that various changes and modifications will be apparent to those skilled in the art. Therefore, such changes and modifications should be construed as being within the scope of the invention.

What is claimed is:

1. A multi-spectral infrared radiation photodetector comprising:
    a plurality of elongate infrared radiation absorbing elements for absorbing at least two bands of infrared radiation, each of the plurality of elements having first and second opposite longitudinal surfaces, the at least two bands of infrared radiation incident upon the first surfaces of the plurality of elements;
    a plurality of electrically interconnected strips respectively being in electrical contact with and extending along the first surfaces of the plurality of elements;
    a bottom contact being in electrical contact with the second surfaces of the plurality of elements, the plurality of strips and the bottom contact to provide for current flow through the plurality of elements in a direction substantially transverse to an axis of the plurality of elements; and
    a reflector for the at least two bands of infrared radiation, the reflector being disposed on an opposite longitudinal surface of the bottom contact from the plurality of elements,
    wherein the plurality of elements, the plurality of strips, the bottom contact and the reflector comprise a diffractive resonant optical cavity for the at least two bands of infrared radiation, and
    wherein a ratio between a photoresponse to each of the at least two bands of infrared radiation is a function of an external bias applied between the plurality of strips and the bottom contact.

2. A multi-spectral infrared radiation photodetector in accordance with claim 1, wherein the plurality of elements comprise multiple quantum well material selected from the group consisting of GaAs, AlGaAs, InGaAs, InP and combinations thereof.

3. A multi-spectral infrared radiation photodetector in accordance with claim 1, wherein the reflector is either a metallic reflector or a Bragg reflector.

4. A multi-spectral infrared radiation photodetector in accordance with claim 1, wherein the at least two bands of infrared radiation is two bands of infrared radiation.

5. A multi-spectral infrared radiation photodetector in accordance with claim 1, wherein the at least two bands of infrared radiation is three bands of infrared radiation.

6. A multi-spectral infrared radiation photodetector comprising:
    a plurality of elongate infrared radiation absorbing elements for absorbing at least two bands of infrared radiation, each of the plurality of elements having first and second opposite longitudinal surfaces, the at least two bands of infrared radiation incident upon the first surfaces of the plurality of elements;
    a plurality of electrically interconnected strips respectively being in electrical contact with and extending along the first surfaces of the plurality of elements;
    a bottom contact being in electrical contact with the second surfaces of the plurality of elements, the plurality of strips and the bottom contact to provide for current flow through the plurality of elements in a direction substantially transverse to an axis of the plurality of elements; and
    a reflector for reflecting the at least two bands of infrared radiation, the reflector being disposed on an opposite longitudinal surface of the bottom contact from the plurality of elements,
    wherein the plurality of elements, the plurality of strips, the bottom contact and the reflector comprise a diffractive resonant optical cavity, the diffractive cavity having a first period in a first direction for diffracting a first band of the at least two bands of infrared radiation and a second period in a second direction for diffracting a second band of the at least two bands of infrared radiation, the second band of infrared radiation different from the first band of infrared radiation, the second direction being substantially perpendicular to the first direction, and
    wherein a ratio between a photoresponse to each of the at least two bands of infrared radiation is a function of an external bias applied between the plurality of strips and the bottom contact.

7. A multi-spectral infrared radiation photodetector in accordance with claim 6, wherein the plurality of elements comprise multiple quantum well material selected from the group consisting of GaAs, AlGaAs, InGaAs, InP and combinations thereof.

8. A multi-spectral infrared radiation photodetector in accordance with claim 6, wherein the reflector is either a metallic reflector or a Bragg reflector.

9. A multi-spectral infrared radiation photodetector in accordance with claim 6, wherein the at least two bands of infrared radiation is two bands of infrared radiation.

10. A multi-spectral infrared radiation photodetector in accordance with claim 6, wherein the at least two bands of infrared radiation is three bands of infrared radiation.

11. A dual-band infrared radiation photodetector comprising:
 a plurality of elongate infrared radiation absorbing elements for absorbing first and second bands of infrared radiation, the second band of infrared radiation different from the first band of infrared radiation, each of the plurality of elements having first and second opposite longitudinal surfaces, the first and second bands of infrared radiation incident upon the first surfaces of the plurality of elements, the plurality of elements comprising multiple quantum well material including GaAs and AlGaAs;
 a plurality of electrically interconnected strips respectively being in electrical contact with and extending along the first surfaces of the plurality of elements;
 a bottom contact being in electrical contact with the second surfaces of the plurality of elements, the plurality of strips and the bottom contact to provide for current flow through the plurality of elements in a direction substantially transverse to an axis of the plurality of elements; and
 a metallic reflector for the first and second bands of infrared radiation, the reflector being disposed on an opposite longitudinal surface of the bottom contact from the plurality of elements,
 wherein the plurality of elements, the plurality of strips, the bottom contact and the reflector comprise a diffractive resonant optical cavity for the first and second bands of infrared radiation, and
 wherein a ratio between a photoresponse to the first and second bands of infrared radiation is a function of an external bias applied between the plurality of strips and the bottom contact.

12. A method of detecting first and second bands of infrared radiation comprising:
 generating a first spectral response curve of a photodetector with a first applied bias, the photodetector including:
  a plurality of elongate infrared absorbing elements for absorbing the first and second bands of infrared radiation, the plurality of elements having first and second opposing surfaces, the first and second bands of infrared radiation incident on the first surfaces of the plurality of elements;
  a plurality of electrically interconnected strips being in electrical contact with and extending along the first surfaces of the plurality of elements;
  a bottom electrical contact being in electrical contact with the second surfaces of the plurality of elements; and
  a reflector for the first and second bands of infrared radiation, the reflector being disposed on an opposite longitudinal surface of the bottom contact from the plurality of elements,
  wherein the plurality of elements, the plurality of strips, the bottom contact and the reflector comprise a diffractive resonant optical cavity for the first and second bands of infrared radiation, and
  wherein a ratio between a photoresponse to the first and second bands of infrared radiation is a function of an external bias applied between the plurality of strips and the bottom contact;
 generating a second spectral response curve of the photodetector at a second applied bias, the second applied bias different from the first applied bias;
 detecting infrared radiation at the first applied bias, thereby creating a first signal;
 detecting infrared radiation at the second applied bias, thereby creating a second signal; and
 deconvolving the first and second signals using the generated first and second spectral response curves, thereby creating a first band signal corresponding to the first band of infrared radiation and a second band signal corresponding to the second band of infrared radiation.

13. A method of detecting first and second bands of infrared radiation in accordance with claim 12, wherein a polarity of the first applied bias is opposite a polarity of the second applied bias.

14. A multi-spectral infrared radiation imager including a plurality of photodetector pixel structures, each of the pixel structures comprising:
 a plurality of elongate infrared radiation absorbing elements for absorbing at least two bands of infrared radiation, each of the plurality of elements having first and second opposite longitudinal surfaces, the at least two bands of infrared radiation incident upon the first surfaces of the plurality of elements;
 a plurality of electrically interconnected strips respectively being in electrical contact with and extending along the first surfaces of the plurality of elements;
 a bottom electrical contact being in electrical contact with the second surfaces of the plurality of elements, the plurality of strips and the bottom contact to provide for current flow through the plurality of elements in a direction substantially transverse to an axis of the plurality of elements; and
 a reflector for the at least two bands of infrared radiation, the reflector being disposed on an opposite longitudinal surface of the bottom contact from the plurality of elements,
 wherein the plurality of elements, the plurality of strips, the bottom contact and the reflector comprise a diffractive resonant optical cavity for the at least two bands of infrared radiation, and
 wherein a ratio between a photoresponse to each of the at least two bands of infrared radiation is a function of an external bias applied between the plurality of strips and the bottom contact.

15. A multi-spectral infrared radiation imager in accordance with claim 14, wherein the plurality of elements of each of the pixel structures comprise multiple quantum well material selected from the group consisting of GaAs, AlGaAs, InGaAs, InP and combinations thereof.

16. A multi-spectral infrared radiation imager in accordance with claim 14, wherein the reflector of each of the pixel structures is either a metallic reflector or a Bragg reflector.

17. A multi-spectral infrared radiation imager in accordance with claim 14, wherein the at least two bands of infrared radiation is two bands of infrared radiation.

18. A multi-spectral infrared radiation imager in accordance with claim 14, wherein the at least two bands of infrared radiation is three bands of infrared radiation.

19. A multi-spectral infrared radiation imager in accordance with claim 14, wherein the multi-spectral infrared radiation imager is a one-dimensional multi-spectral infrared radiation imager.

20. A multi-spectral infrared radiation imager in accordance with claim 14, wherein the multi-spectral infrared radiation imager is a two-dimensional multi-spectral infrared radiation imager.

21. A multi-spectral infrared radiation imager including a plurality of photodetector pixel structures, each of the pixel structures comprising:
- a plurality of elongate infrared radiation absorbing elements for absorbing at least two bands of infrared radiation, each of the plurality of elements having first and second opposite longitudinal surfaces, the at least two bands of infrared radiation incident upon the first surfaces of the plurality of elements;
- a plurality of electrically interconnected strips respectively being in electrical contact with and extending along the first surfaces of the plurality of elements;
- a bottom electrical contact being in electrical contact with the second surfaces of the plurality of elements, the plurality of strips and the bottom contact to provide for current flow through the plurality of elements in a direction substantially transverse to an axis of the plurality of elements; and
- a reflector for reflecting the at least two bands of infrared radiation, the reflector being disposed on an opposite longitudinal surface of the bottom contact from the plurality of elements,
- wherein the plurality of elements, the plurality of strips, the bottom contact and the reflector comprise a diffractive resonant optical cavity, the diffractive cavity having a first period in a first direction for diffracting a first band of the at least two bands of infrared radiation and a second period in a second direction for diffracting a second band of the at least two bands of infrared radiation, the second band of infrared radiation different from the first band of infrared radiation, the second direction being substantially perpendicular to the first direction, and
- wherein a ratio between a photoresponse to each of the at least two bands of infrared radiation is a function of an external bias applied between the plurality of strips and the bottom contact.

22. A multi-spectral infrared radiation imager in accordance with claim 21, wherein the plurality of elements of each of the pixel structures comprise multiple quantum well material selected from the group consisting of GaAs, AlGaAs, InGaAs, InP and combinations thereof.

23. A multi-spectral infrared radiation imager in accordance with claim 21, wherein the reflector of each of the pixel structures is either a metallic reflector or a Bragg reflector.

24. A multi-spectral infrared radiation imager in accordance with claim 21, wherein the at least two bands of infrared radiation is two bands of infrared radiation.

25. A multi-spectral infrared radiation imager in accordance with claim 21, wherein the at least two bands of infrared radiation is three bands of infrared radiation.

26. A multi-spectral infrared radiation imager in accordance with claim 21, wherein the multi-spectral infrared radiation imager is a one-dimensional multi-spectral infrared radiation imager.

27. A multi-spectral infrared radiation imager in accordance with claim 21, wherein the multi-spectral infrared radiation imager is a two-dimensional multi-spectral infrared radiation imager.

28. A dual-band infrared radiation imager comprising:
- a plurality of photodetector pixel structures, each of the plurality of photodetector pixel structures including:
  - a plurality of elongate infrared radiation absorbing elements for absorbing first and second bands of infrared radiation, the second band of infrared radiation different from the first band of infrared radiation, each of the plurality of elements having first and second opposite longitudinal surfaces, the first and second bands of infrared radiation incident upon the first surfaces of the plurality of elements, the plurality of elements comprising multiple quantum well material including GaAs and AlGaAs;
  - a plurality of electrically interconnected strips respectively being in electrical contact with and extending along the first surfaces of the plurality of elements;
  - a bottom electrical contact being in electrical contact with the second surfaces of the plurality of elements, the plurality of strips and the bottom contact to provide for current flow through the plurality of elements in a direction substantially transverse to an axis of the plurality of elements; and
  - a metallic reflector for the first and second bands of infrared radiation, the reflector being disposed on an opposite longitudinal surface of the bottom contact from the plurality of elements,
  - wherein the plurality of elements, the plurality of strips, the bottom contact and the reflector comprise a diffractive resonant optical cavity for the first and second bands of infrared radiation, and
  - wherein a ratio between a photoresponse to the first and second bands of infrared radiation is a function of an external bias applied between the plurality of strips and the bottom contact, and
- a readout integrated circuit, the readout integrated circuit for sequentially applying first and second external biases between the plurality of strips and the bottom contact of each of the plurality of photodetector pixel structures, the readout integrated circuit for multiplexing the photoresponse of each of the plurality of photodetector pixel structures at the first and second external biases.

* * * * *